United States Patent
Zheng

(10) Patent No.: US 10,390,409 B2
(45) Date of Patent: Aug. 20, 2019

(54) OPTICAL MODULE

(71) Applicants: Hisense Broadband Multimedia Technologies Co., Ltd., Qingdao, Shandong (CN); Hisense Broadband Multimedia Technologies, Ltd., Tortola (VG)

(72) Inventor: Long Zheng, Shandong (CN)

(73) Assignees: Hisense Broadband Multimedia Technologies Co., Ltd., Qingdao, Shandong (CN); Hisense Broadband Multimedia Technologies, Ltd., Tortola (VG)

( * ) Notice: Subject to any disclaimer, the term of this patent is extended or adjusted under 35 U.S.C. 154(b) by 0 days.

(21) Appl. No.: 15/857,958

(22) Filed: Dec. 29, 2017

(65) Prior Publication Data

US 2018/0292078 A1     Oct. 11, 2018

(30) Foreign Application Priority Data

Apr. 6, 2017    (CN) .......................... 2017 1 0220900
May 17, 2017    (CN) .......................... 2017 1 0365787
(Continued)

(51) Int. Cl.
*G02B 27/20*    (2006.01)
*H05B 37/02*    (2006.01)
(Continued)

(52) U.S. Cl.
CPC .......... *H05B 37/0209* (2013.01); *F21V 5/04* (2013.01); *F21V 23/005* (2013.01);
(Continued)

(58) Field of Classification Search
CPC .... F21V 23/005; F21V 29/504; F21V 29/508; F21V 29/83; F21V 5/04; G02B 6/4206;
(Continued)

(56) References Cited

U.S. PATENT DOCUMENTS

2002/0131122 A1*  9/2002  Anderl ................. H04B 10/806
                                                           398/135
2004/0151505 A1*  8/2004  Aronson ............. H01S 5/02212
                                                           398/138
(Continued)

FOREIGN PATENT DOCUMENTS

CN    103915402 A    7/2014
CN    104122632 A    10/2014
CN    205263366 U    5/2016

OTHER PUBLICATIONS

First Office Action received for CN Application No. CN 201710365787.5 dated Jul. 19, 2018 (English and Chinese language) (13 pp.).

*Primary Examiner* — Thien M Le
(74) *Attorney, Agent, or Firm* — Brinks Gilson & Lione

(57) ABSTRACT

This application discloses an optical module, including a circuit board, a lens assembly, a laser driver, and a limiting amplifier. Heat dissipation layers are disposed on the upper and lower surfaces of the circuit board. The laser driver and the limiting amplifier are mounted on the surface of the heat dissipation layer on the upper surface. Via holes are provided in projection regions of the laser driver and the limiting amplifier on the circuit board. Via holes penetrate the circuit board and are connected to the heat dissipation layers. Via holes are filled with a heat conductor, and the heat conductor is connected to the heat dissipation layers on the upper surface and the lower surface of the circuit board. The optical module disclosed in this application effectively dissipates heat generated by the laser driver and the limiting amplifier, thereby reducing the temperature in the optical module.

22 Claims, 4 Drawing Sheets

(30) Foreign Application Priority Data

| | | |
|---|---|---|
| May 23, 2017 | (CN) | 2017 1 0370658 |
| Jul. 19, 2017 | (CN) | 2017 1 0592117 |
| Aug. 17, 2017 | (CN) | 2017 1 0706221 |
| Aug. 22, 2017 | (CN) | 2017 1 0725586 |
| Sep. 18, 2017 | (CN) | 2017 1 0842912 |
| Oct. 10, 2017 | (CN) | 2017 1 0934006 |

(51) Int. Cl.

| | |
|---|---|
| *F21V 29/504* | (2015.01) |
| *F21V 29/508* | (2015.01) |
| *F21V 29/83* | (2015.01) |
| *F21V 5/04* | (2006.01) |
| *F21V 23/00* | (2015.01) |
| *G02B 6/42* | (2006.01) |
| *H05K 9/00* | (2006.01) |
| *H04B 10/40* | (2013.01) |
| *H04B 10/50* | (2013.01) |
| *H04B 10/85* | (2013.01) |
| *H04B 15/02* | (2006.01) |

(52) U.S. Cl.
CPC .......... *F21V 29/504* (2015.01); *F21V 29/508* (2015.01); *F21V 29/83* (2015.01); *G02B 6/4206* (2013.01); *G02B 6/428* (2013.01); *G02B 6/4214* (2013.01); *G02B 6/4246* (2013.01); *G02B 6/4251* (2013.01); *G02B 6/4256* (2013.01); *G02B 6/4274* (2013.01); *G02B 6/4283* (2013.01); *G02B 6/4292* (2013.01); *H04B 10/40* (2013.01); *H04B 10/503* (2013.01); *H04B 10/85* (2013.01); *H04B 15/02* (2013.01); *H05K 9/0058* (2013.01)

(58) Field of Classification Search
CPC .. G02B 6/4214; G02B 6/4246; G02B 6/4251; G02B 6/4256; G02B 6/4274; G02B 6/428; G02B 6/4283; G02B 6/4292; H04B 10/40; H04B 10/503; H04B 10/85; H04B 15/02; H05B 37/0209; H05K 9/0058
USPC ....................................................... 362/259
See application file for complete search history.

(56) References Cited

U.S. PATENT DOCUMENTS

| | | | | |
|---|---|---|---|---|
| 2004/0179562 | A1* | 9/2004 | Carroll | H01S 5/02212 372/36 |
| 2004/0207988 | A1* | 10/2004 | Branch | H05K 7/1428 361/728 |
| 2005/0077609 | A1* | 4/2005 | Yao | C25D 5/02 257/691 |
| 2014/0044388 | A1* | 2/2014 | Su | H01L 31/024 385/14 |
| 2016/0085038 | A1* | 3/2016 | Decker | G02B 6/4204 385/14 |
| 2016/0133558 | A1* | 5/2016 | Stahr | H01L 23/36 257/692 |
| 2016/0266322 | A1* | 9/2016 | Epitaux | G02B 6/4292 |

* cited by examiner

OPTICAL MODULE

CROSS REFERENCES

The present application claims priority to Chinese Patent Application No. 201710934006.X filed on Oct. 10, 2017, Chinese Patent Application No. 201710842912.7 filed on Sep. 18, 2017, Chinese Patent Application No. 201710725586.1 filed on Aug. 22, 2017, Chinese Patent Application No. 201710706221.4 filed on Aug. 17, 2017, Chinese Patent Application No. 201710592117.7 filed on Jul. 19, 2017, Chinese Patent Application No. 201710370658.5 filed on May 23, 2017, Chinese Patent Application No. 201710365787.5 filed on May 17, 2017, and Chinese Patent Application No. 201710220900.0 filed on Apr. 6, 2017, which are herein incorporated by reference in their entireties.

The present application is relevant to the following four (4) U.S. patent applications, filed concurrently with the present application, the entireties of which are hereby incorporated by reference: U.S. patent application Ser. No. 15/857,855, entitled "Optical Module," filed on Dec. 29, 2017; U.S. patent application Ser. No. 15/857,884, entitled "Optical Module," filed on Dec. 29, 2017; U.S. patent application Ser. No. 15/857,942, entitled "Optical Module," filed on Dec. 29, 2017; and U.S. patent application Ser. No. 15/857,987, entitled "Optical Module," filed on Dec. 29, 2017.

BACKGROUND

Technical Field

This application relates to the field of heat dissipation technologies, and in particular, to an optical module.

Related Art

An optical module is an optical-to-electrical and electrical-to-optical conversion apparatus having an optoelectronic component, a functional circuit, and an optical interface, and mainly includes a transmission assembly and a receiving assembly. The transmission assembly converts an electrical signal to an optical signal. After the transmission assembly transmits the optical signal by using an optical fiber, a receiving assembly in a peer-end optical module converts the optical signal to an electrical signal.

Referring to FIG. 1A and FIG. 1B, FIG. 1A is a schematic structural diagram of an optical module, and FIG. 1B is a schematic cross-sectional structural view of the optical module. As shown in FIG. 1A and FIG. 1B, the optical module includes: a circuit board 1, a transmission assembly, a receiving assembly, and a lens assembly 2. The transmission assembly and the receiving assembly are mounted on the surface of the circuit board. The lens assembly 2 is designed as a cover structure for refracting and reflecting light emitted by a laser, and covers the transmission assembly and the receiving assembly. The transmission assembly mainly includes a laser driver 3 and a laser 4 that are electrically connected to each other. The laser driver 3 is used for driving the laser 4 to emit light. The receiving assembly includes a limiting amplifier 5 and an optical detector 6 that are electrically connected to each other. The optical detector 6 is used for converting a detected optical signal to a corresponding electrical signal. The limiting amplifier 5 performs amplification, trans-impedance, and gain adjustment of the electrical signal obtained by the optical detector 6. It can be learned from the foregoing description that, the laser driver 3, the laser 4, the limiting amplifier 5, and the optical detector 6 in the optical module are all main heat generation components, and a higher working frequency of the optical module indicates a larger quantity of generated heat. This is particularly true when the optical module includes a plurality of transmission assemblies or receiving assemblies. In addition, the transmission assembly and the receiving assembly are disposed in a cover-structured cavity of the lens assembly 2, leading to that the generated heat cannot be dissipated in time. For an optical module having a low working frequency, for example, a 10 G or 25 G optical module, relatively smaller amount of heat is generated, and the heat may be dissipated by using the circuit board 1 that is in direct contact with the components, or can be dissipated by filling a heat conductor in a housing of the optical module.

However, for an optical module having a high working frequency and great power consumption, much larger amount of heat is generated. Consequently, the heat generated by the optical module cannot be quickly dissipated by using a circuit board in contact with components or by filling a heat conductor in the housing. Therefore, how to quickly dissipate the heat in the optical module is a problem needing to be resolved.

SUMMARY

Embodiments of the present disclosure provide an optical module, so as to resolve a problem of how to quickly dissipate the heat in the optical module.

In an optical module provided in an embodiment of the present disclosure, The optical module includes a circuit board, a lens assembly, a laser driver, and a limiting amplifier. A heat dissipation layer is disposed on each of an upper surface and a lower surface of the circuit board, the laser driver and the limiting amplifier are mounted on the surface of the heat dissipation layer that is on the upper surface of the circuit board, and the lens assembly covers the laser driver and the limiting amplifier. A plurality of via holes is provided in projection regions of the laser driver and the limiting amplifier on the circuit board, and each of the plurality of via holes penetrates the circuit board and is connected to the heat dissipation layers on the upper surface and the lower surface of the circuit board. Each of the plurality of via holes is filled with a heat conductor, and the heat conductor is connected to the heat dissipation layers on the upper surface and the lower surface of the circuit board.

It should be understood that the foregoing general description and the following detailed description are merely exemplary and illustrative, but should not constitute any limitation to the present disclosure.

BRIEF DESCRIPTION OF THE DRAWINGS

To describe the technical solutions of this application more clearly, the following briefly describes the accompanying drawings required for describing the embodiments. Apparently, a person of ordinary skill in the art may still derive other drawings from these accompanying drawings without creative efforts.

DETAILED DESCRIPTION

Exemplary embodiments are described in detail herein, and examples of the exemplary embodiments are shown in the accompanying drawings. When the accompanying drawings are used in the description, same numbers in different accompanying drawings represent same or similar elements, unless otherwise specified. The implementations described in the following exemplary embodiments do not represent all implementations consistent with the present disclosure. On the contrary, the implementations are merely examples of the apparatus and method consistent with the detailed description in the claims or some aspects of the present disclosure.

An optical module is a carrier for transmission between a switch and a device, and has a function of optical-to-electrical conversion. The optical module has a high working frequency, thereby causing great power consumption and generating much heat in a working process.

An optical module provided in the embodiments of this application can effectively dissipate heat generated by a laser driver 3 and a limiting amplifier 5 in the optical module.

Figure 1A:
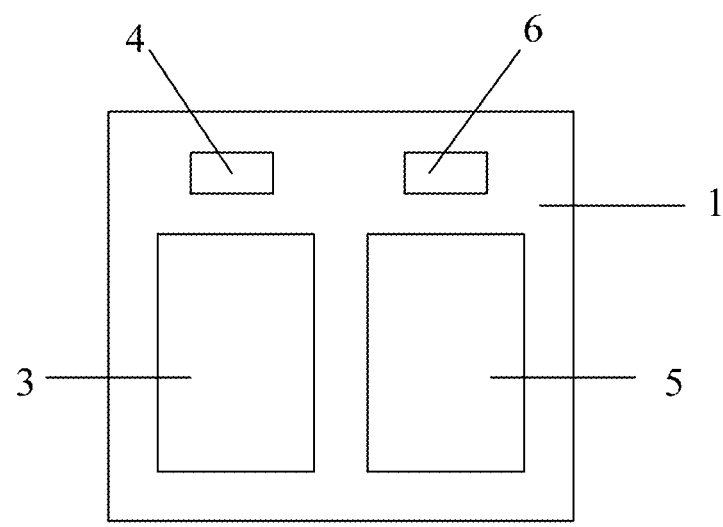
FIGS. 1A and 1B are a schematic structural diagram and a schematic cross-sectional structural view of an optical module.
Figure 1B:
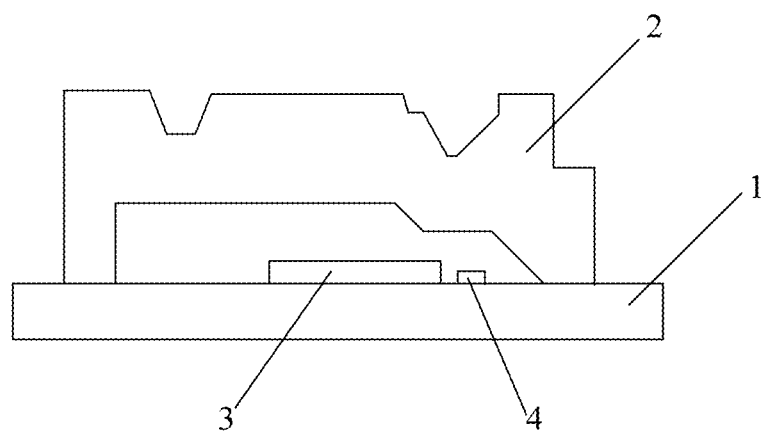
Figure 2:
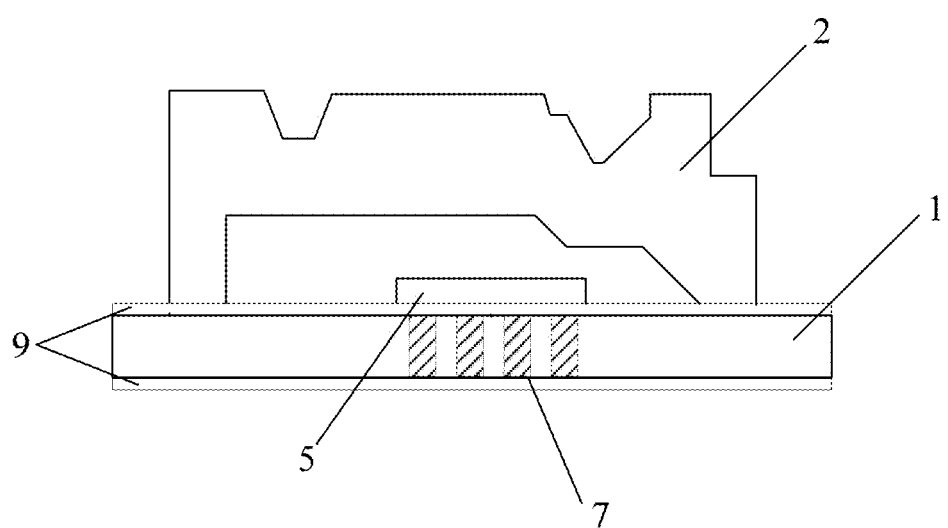
FIG. 2 is a schematic structural diagram of an optical module according to an embodiment of this application.

FIG. 2 is a schematic structural diagram of an optical module according to an embodiment of this application. As shown in FIGS. 1A, 1B and 2, the optical module includes: a circuit board 1, a lens assembly 2, a laser driver 3, and a limiting amplifier 5. Referring to FIG. 1A, the laser driver 3 is electrically connected to a laser 4, and the laser driver 3 is used for driving the laser 4 to output light. An optical detector 6 and the limiting amplifier 5 are a light receiving assembly in the optical module. The optical detector 6 can detect the power of light incident to the surface of the optical detector 6 and convert the light output by the laser 4 to a corresponding electric signal. The corresponding electric signal may be a current or a voltage. The limiting amplifier 5 filters out electrical signals that are excessively high or excessively low, to protect a circuit from being affected by the excessively high or excessively low signals, and is generally used for signal shaping and over-voltage protection.

Each of the laser driver 3 and the limiting amplifier 5 includes a chip. The chip is a primary heat generation component. In one embodiment, a plurality of via holes 7 is provided in projection regions of the laser driver 3 and the limiting amplifier 5 mounted on the surface of the circuit board 1. Each of the plurality of via holes 7 is filled with a heat conductor, and the heat conductor matches the via hole 7, for example but not limiting, a size of the heat conductor matches a size of the via hole. The via hole 7 is a hole at an intersection for connecting lines, and is used for electrical connection, fastening, or positioning of an component. In process, a layer of metal is plated on the cylindrical surface of a hole wall of the via hole 7 by means of chemical deposition, to communicate with copper foil that is on each intermediate layer and that needs to be communicated. The plurality of via holes 7 is used for dissipating heat.

A heat dissipation layer 9 is disposed on each of the upper surface and the lower surface of the circuit board 1. The laser driver 3 and the limiting amplifier 5 are mounted on the surface of the heat dissipation layer 9. In this embodiment provided in this application, each of the plurality of via holes 7 is provided in the projection regions of the laser driver 3 and the limiting amplifier 5 on the circuit board 1, so that the quantity of via holes 7 on the circuit board 1 is reduced, and heat dissipation is achieved.

In an embodiment, to more effectively improve the heat dissipation effect of the optical module, the via holes 7 are set to be through-via holes. That is, the through-via holes penetrate the circuit board 1, and the through-via holes penetrate the projection regions of the laser driver 3 and the limiting amplifier 5 on the surface of the circuit board 1. Because the through-via holes 7 penetrate the circuit board 1, the heat conductor disposed in each of the plurality of via holes 7 is connected to the heat dissipation layer 9 on the upper surface of the circuit board 1 and the heat dissipation layer 9 on the lower surface of the circuit board 1, ensuring that heat generated by the laser driver 3 and the limiting amplifier 5 in a working process is conducted to the heat conductors in the plurality of via holes 7 by using the heat dissipation layer 9 on the upper surface of the circuit board 1, and then conducted to the heat dissipation layer 9 on the lower surface of the circuit board 1 by using the heat conductors, and finally dissipated to the outside.

When the via holes 7 are set to be through-via holes 7, the surface of the circuit board 1 is not smooth, affecting mounting of an electrical component. Therefore, the heat dissipation layer 9 on the upper surface of the circuit board 1 can facilitate the mounting of the electrical component. In addition, the heat generated by the laser driver 3 and the limiting amplifier 5 can be conducted to the heat conductors in the via holes 7 by using the heat dissipation layer 9 on the upper surface of the circuit board 1.

It can be learned from the foregoing description that the heat dissipation layer 9 on the upper surface of the circuit board 1 can conduct the heat generated by the chips in the laser driver 3 and the limiting amplifier 5 to the heat conductors in the via holes, and the heat conductors conduct the heat to the heat dissipation layer 9 on the lower surface of the circuit board 1, so that the heat is conducted to the outside world. Therefore, the heat dissipation layers 9 on the upper surface and the lower surface of the circuit board 1 have a heat-conducting function.

Optionally in some embodiment, the plurality of via holes 7 can not only dissipate heat, but also has an electricity-conducting function. Therefore, grounds of the chips in the laser driver 3 and the limiting amplifier 5 are connected to the heat dissipation layer 9 on the upper surface of the circuit board 1, and the heat dissipation layer 9 on the upper surface of the circuit board 1 is electrically connected to the heat dissipation layer 9 on the lower surface of the circuit board 1 by using the via holes 7, thereby achieving the electricity-conducting function. In this way, the heat dissipation layers 9 on the upper surface and the lower surface of the circuit board 1 have both the heat-conducting function and the electricity-conducting function. For example, in this embodiment of this application, the heat dissipation layers 9 on the upper surface and the lower surface of the circuit board 1 may be set to copper foil having the electricity-conducting function and the heat-conducting function.

Therefore, in the optical module provided in one embodiment of this disclosure, the heat dissipation layer 9 is disposed on each of the upper surface and the lower surface of the circuit board 1. The laser driver 3 and the limiting amplifier 5 are mounted on the surface of the heat dissipation layer 9 that is on the upper surface of the circuit board 1. The plurality of via holes 7 penetrating the circuit board is provided in the projection regions of the laser driver 3 and the limiting amplifier 5 on the circuit board 1. Each of the plurality of via holes 7 is connected to the heat dissipation layers 9 on the upper surface and the lower surface of the circuit board 1, to transmit an electrical signal received by the heat dissipation layer 9 on the upper surface of the circuit board 1 to the heat dissipation layer 9 on the lower surface of the circuit board 1 by using the via hole 7. The heat conductor is disposed in each of the plurality of via holes 7, and the heat conductor is connected to the heat dissipation layers 9 on the upper surface and the lower surface of the circuit board 1, so that the heat is dissipated to the outside world by using the heat dissipation layer 9 on the upper surface of the circuit board 1, the heat conductors, and the heat dissipation layer 9 on the lower surface of the circuit board 1. By means of the plurality of via holes 7, the heat generated by the laser driver 3 and the limiting amplifier 5 can be dissipated to the outside world by using the heat dissipation layer 9 on the upper surface of the circuit board 1, the heat conductors, and the heat dissipation layer 9 on the lower surface of the circuit board 1, so as to reduce the temperature in the lens assembly 2, and ensure a proper working environment for the laser driver 3 and the limiting amplifier 5.

Figure 3:
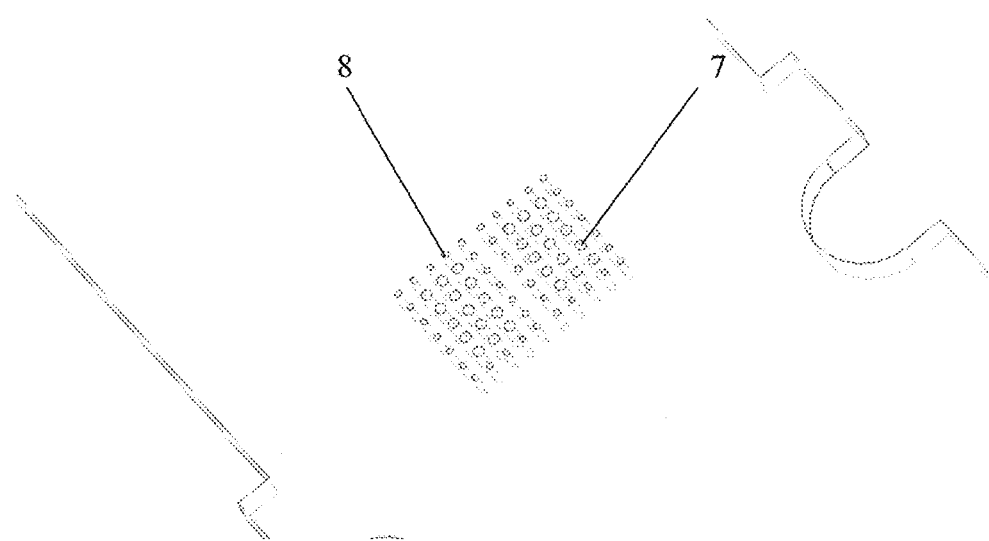
FIG. 3 is a schematic structural diagram of a via hole according to an embodiment of this application.

Referring to FIG. 3, FIG. 3 is a schematic structural diagram of a via hole 7 according to an embodiment of this application. As shown in FIG. 3, a plurality of auxiliary heat dissipation holes 8 is provided on the periphery of each of projection regions of chips in a laser driver 3 and a limiting amplifier 5 on a circuit board 1. The diameter of the auxiliary heat dissipation hole 8 is smaller than the diameter of the via hole 7. Heat generated by the laser driver 3 and the limiting amplifier 5 is radiated outward from the center of the projection region or from a region having the highest temperature, and consequently the temperature on the periphery of the projection region increases. Therefore, when heat dissipation is performed on a projection region of a heat generation component, the auxiliary heat dissipation holes 8 are provided on the periphery of the projection region, and each of the auxiliary heat dissipation holes 8 is filled with a heat conductor, so that the heat radiated to the periphery of the projection region is conducted to an outside space.

Because the temperature of the heat decreases when the heat is radiated outward, the temperature on the periphery of the projection region is lower than the temperature in the projection region. Therefore, the diameter of the auxiliary heat dissipation hole 8 on the periphery of the projection region is smaller than the diameter of the via hole 7 in the projection region, to assist the heat dissipation performed by the via hole 7 on the projection region, and prevent the heat from being radiated to other components and affecting the working of the other components. The auxiliary heat dissipation hole 8 may also be set to be a through-via hole 7. For example, if the via hole 7 is set to be a through-via hole 7, the auxiliary heat dissipation hole 8 is also set to a through-via hole 7. Optionally, the auxiliary heat dissipation hole 8 may alternatively be set to a ground hole.

In one embodiment, the temperature of the heat generated by the laser driver 3 and the limiting amplifier 5 in the projection region varies. Generally, the central region of the projection region is a main heat emitting region. Therefore, the temperature in the central region may be the highest, and the temperature of the heat gradually decreases as the heat is radiated outward from the central region of the projection region. Therefore, it is set that the diameters of the plurality of via holes 7 gradually decrease outward from the central region of the projection region, so that the plurality of via holes 7 can be provided in a limited space of the projection region and the heat can be fully dissipated.

In some embodiment, it is set that the arrangement density of the plurality of via holes 7 gradually decreases outward from the center of the projection region, so that the density of the via holes 7 is higher in the center of the projection region and lower on the periphery of the projection region. In this way, the heat in the center of the projection region can be quickly dissipated. In addition, a space in the circuit board 1 occupied by the via holes 7 is reduced and the quantity of the via holes 7 is reduced on the premise that the via holes 7 arranged in a small density on the periphery are capable of dissipating heat.

Figure 4:
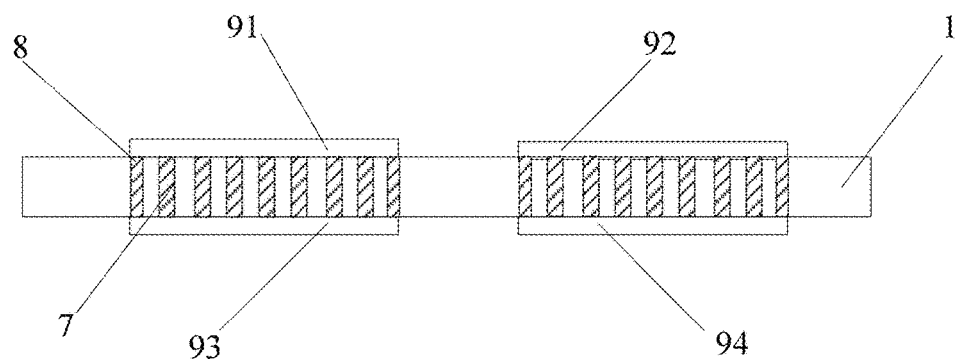
FIG. 4 is a schematic structural diagram of another optical module according to an embodiment of this application.
Figure 5:
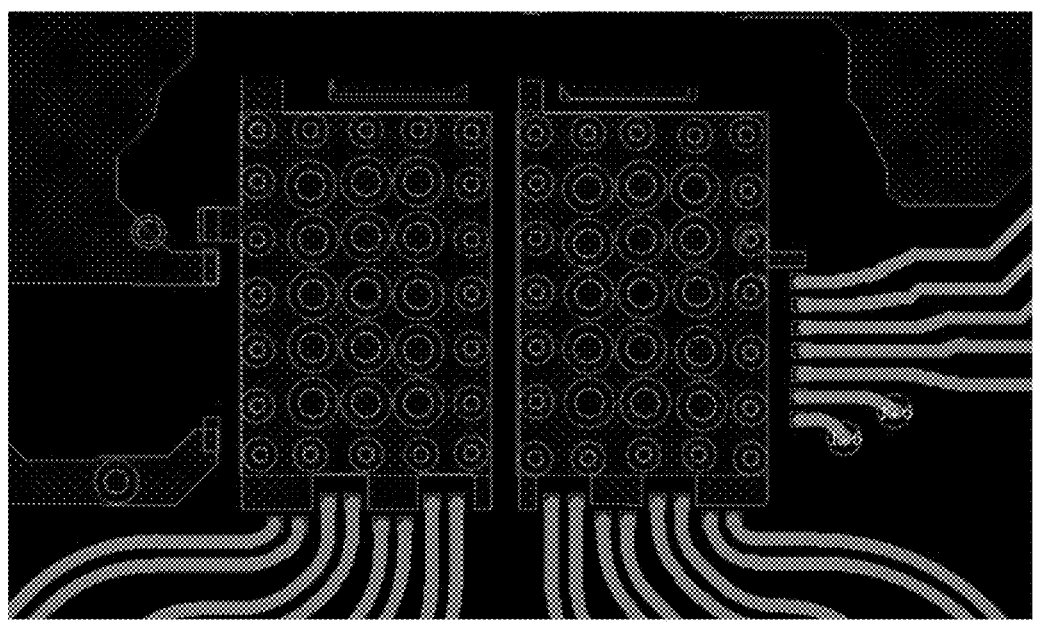
FIG. 5 is a schematic structural diagram of a via hole and an auxiliary heat dissipation hole according to an embodiment of this application.

Referring to FIG. 4, FIG. 4 is a schematic structural diagram of another optical module according to an embodiment of this application. As shown in FIG. 4, a heat dissipation layer 9 on the upper surface of a circuit board 1 separates a projection region of a laser driver 3 on the circuit board 1 from a projection region of a limiting amplifier 5 on the circuit board 1. That is, a first heat dissipation layer 91 is disposed in the projection region of the laser driver 3 on the circuit board 1, and a second heat dissipation layer 92 is disposed in the projection region of the limiting amplifier 5 on the circuit board 1. The first heat dissipation layer 91 is separated from the second heat dissipation layer 92. A ground of the laser driver 3 is electrically connected to the first heat dissipation layer 91, and a ground of the limiting amplifier 5 is electrically connected to the second heat dissipation layer 92.

Likewise, a third heat dissipation layer 93 corresponding to the first heat dissipation layer 91 and a fourth heat dissipation layer 94 corresponding to the second heat dissipation layer 92 are respectively disposed on the lower surface of the circuit board 1, and the third heat dissipation layer 93 is separated from the fourth heat dissipation layer 94. The first heat dissipation layer 91 is connected to the third heat dissipation layer 93 by using a plurality of via holes 7, and the second heat dissipation layer 92 is connected to the fourth heat dissipation layer 94 by using a plurality of via holes 7.

A ground signal of the laser driver 3 needs to be connected to the circuit board 1 by using the heat dissipation layer 9 on the upper surface of the circuit board 1. However, during normal working of the optical module, high-frequency noise of the laser driver 3 is easily conducted to the circuit board 1 by using the heat dissipation layer 9 on the upper surface of the circuit board 1. Consequently, the heat dissipation layer 9 on the upper surface of the connected circuit board 1 is prone to cause the high-frequency noise of the laser driver 3 to affect the performance of the limiting amplifier 5, and crosstalk easily occurs between the ground signal of the laser driver 3 and a ground signal of the limiting amplifier 5.

In one embodiment of this disclosure, by separating the first heat dissipation layer 91 from the second heat dissipation layer 92, and separating the third heat dissipation layer 93 from the fourth heat dissipation layer 94, the ground of the laser driver 3 and the ground of the limiting amplifier 5 connecting to the heat dissipation layer 9 on the upper surface of the circuit board 1 is effectively prevented, so that the ground signal of the laser driver 3 and the ground signal of the limiting amplifier 5 can be effectively prevented from being mutually interfered on the heat dissipation layer 9 on the upper surface of the circuit board 1. Thus, the sensitivity of receiving a signal by the limiting amplifier 5 is less affected by the laser driver 3, and the performance of the laser driver 3 and the performance of the limiting amplifier 5 are ensured. In addition, by separating the third heat dissipation layer 93 from the fourth heat dissipation layer 94, mutual crosstalk between an electrical signal of the laser driver 3 and an electrical signal of the limiting amplifier 5 can be avoided after the electrical signals are transmitted to the heat dissipation layer 9 on the lower surface of the circuit board 1 by using the plurality of via holes 7.

With reference to FIGS. 1A, 1B, and 2-5, the projection region of the laser driver 3 on the circuit board 1 is separated from the projection region of the limiting amplifier 5 on the circuit board 1, and a circuit layout of the laser driver 3 is separated from a circuit layout of the limiting amplifier 5, thereby reducing mutual interference between signals in a working process. In addition, the plurality of via holes 7 is provided in each of the projection regions of the laser driver 3 and the limiting amplifier 5 on the circuit board 1. Auxiliary heat dissipation holes 8 are provided on the periphery of the projection regions, to dissipate heat generated by the laser driver 3 from the inside of a lens assembly 2 to the outside of the lens assembly 2 by using the first heat dissipation layer 91, heat conductors in the plurality of via holes 7, and the third heat dissipation layer 93 in time, and dissipate heat generated by the limiting amplifier 5 from the inside of the lens assembly 2 to the outside of the lens assembly 2 by using the second heat dissipation layer 92, the heat conductors in the plurality of via holes 7, and the fourth heat dissipation layer 94 in time.

In one embodiment, the via holes 7 are provided in the projection regions of the laser driver 3 and the limiting amplifier 5 mounted on the circuit board 1, and the via holes 7 are filled with the heat conductors, so that the heat generated by the laser driver 3 and the limiting amplifier 5 in the working process is conducted to the outside of the optical module by using the via holes 7 and the heat conductors, thereby reducing the temperature of the laser driver 3 and the limiting amplifier 5. In addition, the first heat dissipation layer 91 is disposed corresponding to the projection region of the laser driver 3 on the circuit board 1 and the second heat dissipation layer 92 is disposed corresponding to the projection region of the limiting amplifier 5 on the circuit board 1, and the third heat dissipation layer 93 corresponding to the first heat dissipation layer 91 and the fourth heat dissipation layer 94 corresponding to the second heat dissipation layer 92 are disposed on the lower surface of the circuit board 1. In this way, the heat dissipation layer 9 on the upper surface of the circuit board 1 can conduct the heat to the heat conductors in the via holes 7, and the heat conductors conduct the heat to the heat dissipation layer 9 on the lower surface of the circuit board 1. In addition, by separating the first heat dissipation layer 91 from the second heat dissipation layer 92 and separating the third heat dissipation layer 93 from the fourth heat dissipation layer 94, crosstalk between the circuit of the laser driver 3 and the circuit of the limiting amplifier 5 can be reduced.

Other implementations of the present disclosure will be apparent to a person skilled in the art from consideration of the specification and practice of the present disclosure disclosed herein. This application is intended to cover any variations, uses or adaptation of the present disclosure following the general principles of the present disclosure and including the well-known knowledge or conventional technical means in the art that are not disclosed in the present disclosure. The specification and the embodiments are merely exemplary, and the real scope and spirit of the present disclosure are subject to the appended claims.

It should be understood that, the present disclosure is not limited to the foregoing accurate structures described and shown in the accompanying drawings, and various modifications and variations may be made to the present disclosure without departing from the scope of the present disclosure. The scope of the present disclosure is merely subject to the appended claims.

What is claimed is:

1. An optical module, comprising:
    a circuit board having an upper surface and a lower surface;
    an upper heat dissipation layer having a first surface and a second surface, and disposed on the upper surface of the circuit board with the first surface facing the circuit board;
    a lower heat dissipation layer disposed on the lower surface of the circuit board;
    a laser driver disposed on the second surface of the upper heat dissipation layer over the upper surface of the circuit board;
    a limiting amplifier disposed on the second surface of the upper heat dissipation layer over the upper surface of the circuit board; and
    a plurality of via holes disposed in a first projection region of the laser driver and a second projection region of the limiting amplifier on the circuit board, wherein:
        the plurality of via holes penetrate the circuit board and connect the upper heat dissipation layer on the upper surface and the lower heat dissipation layer on the lower surface of the circuit board, and
        the plurality of via holes are filled with a heat conductor connecting the upper heat dissipation layer on the upper surface and the lower heat dissipation layer on the lower surface of the circuit board.

2. The optical module according to claim 1, further comprising a lens assembly, wherein the lens assembly is disposed over the laser driver and the limiting amplifier.

3. The optical module according to claim 1, wherein:
    the upper heat dissipation layer comprises a first portion and a second portion, wherein:
        the first portion of the upper heat dissipation layer is disposed in the first projection region of the laser driver on the circuit board,
        the second portion of the upper heat dissipation layer is disposed in the second projection region of the limiting amplifier on the circuit board, and
        the first portion of the upper heat dissipation layer separate from the second portion of the upper heat dissipation layer;
    a ground of the laser driver connects to the first portion of the upper heat dissipation layer;
    a ground of the limiting amplifier connects to the second portion of the upper heat dissipation layer; and
    the lower heat dissipation layer comprises a third portion and a fourth portion, wherein:
        the plurality of via holes connect the first portion of the upper heat dissipation layer to the third portion of the lower heat dissipation layer and connect the second portion of the upper heat dissipation layer to the fourth portion of the lower heat dissipation layer.

4. The optical module according to claim 1, wherein:
    a plurality of auxiliary heat dissipation holes are disposed on a periphery of the first projection region of the laser driver and the second projection region of the limiting amplifier on the circuit board.

5. The optical module according to claim 4, wherein:
    diameters of the plurality of via holes are greater than diameters of the auxiliary heat dissipation holes.

6. The optical module according to claim 4, wherein:
    the plurality of auxiliary heat dissipation holes are filled with heat conducting material.

7. The optical module according to claim 1, wherein:
shapes of regions encircled by the plurality of via holes in the first projection region of the laser driver and the second projection region of the limiting amplifier on the circuit board correspond to shapes of the first projection region of the laser driver and the second projection region of the limiting amplifier on the circuit board, respectively.

8. The optical module according to claim 1, wherein:
the plurality of via holes are evenly arranged in the first projection region of the laser driver and the second projection region of the limiting amplifier on the circuit board.

9. The optical module according to claim 1, wherein:
an arrangement density of the plurality of via holes gradually decreases outward from centers of in the first projection region of the laser driver and the second projection region of the limiting amplifier on the circuit board.

10. The optical module according to claim 1, wherein:
diameters of the plurality of via holes gradually decrease outward from centers of in the first projection region of the laser driver and the second projection region of the limiting amplifier on the circuit board.

11. The optical module according to claim 1, further comprising a lens assembly, wherein the lens assembly is disposed over the laser driver.

12. The optical module according to claim 1, further comprising a lens assembly, wherein the lens assembly is disposed over the limiting amplifier.

13. A method for dissipating heat generated in an optical module, the method comprising using or constructing an optical module, wherein the optical module comprises:
a circuit board having an upper surface and a lower surface;
an upper heat dissipation layer having a first surface and a second surface, and disposed on the upper surface of the circuit board with the first surface facing the circuit board;
a lower heat dissipation layer disposed on the lower surface of the circuit board;
a laser driver disposed on the second surface of the upper heat dissipation layer over the upper surface of the circuit board;
a limiting amplifier disposed on the second surface of the upper heat dissipation layer over the upper surface of the circuit board; and
a plurality of via holes disposed in a first projection region of the laser driver and a second projection region of the limiting amplifier on the circuit board, wherein:
the plurality of via holes penetrate the circuit board and connect the upper heat dissipation layer on the upper surface and the lower heat dissipation layer on the lower surface of the circuit board, and
the plurality of via holes are filled with a heat conductor connecting the upper heat dissipation layer on the upper surface and the lower heat dissipation layer on the lower surface of the circuit board.

14. The method according to claim 13, wherein the optical module further comprises a lens assembly, wherein the lens assembly is disposed over the laser driver and the limiting amplifier.

15. The method according to claim 13, wherein:
the upper heat dissipation layer comprises a first portion and a second portion, wherein:
the first portion of the upper heat dissipation layer is disposed in the first projection region of the laser driver on the circuit board,
the second portion of the upper heat dissipation layer is disposed in the second projection region of the limiting amplifier on the circuit board, and
the first portion of the upper heat dissipation layer separate from the second portion of the upper heat dissipation layer;
a ground of the laser driver connects to the first portion of the upper heat dissipation layer;
a ground of the limiting amplifier connects to the second portion of the upper heat dissipation layer; and
the lower heat dissipation layer comprises a third portion and a fourth portion, wherein:
the plurality of via holes connect the first portion of the upper heat dissipation layer to the third portion of the lower heat dissipation layer and connect the second portion of the upper heat dissipation layer to the fourth portion of the lower heat dissipation layer.

16. The method according to claim 13, wherein:
a plurality of auxiliary heat dissipation holes are provided on a periphery of the first projection region of the laser driver and the second projection region of the limiting amplifier on the circuit board.

17. The method according to claim 16, wherein:
diameters of the plurality of via holes are greater than diameters of the auxiliary heat dissipation holes.

18. The method according to claim 16, wherein:
the plurality of auxiliary heat dissipation holes are filled with heat conducting material.

19. The method according to claim 13, wherein:
shapes of regions encircled by the plurality of via holes in the first projection region of the laser driver and the second projection region of the limiting amplifier on the circuit board correspond to shapes of the first projection region of the laser driver and the second projection region of the limiting amplifier on the circuit board, respectively.

20. The method according to claim 13, wherein:
the plurality of via holes are evenly arranged in the first projection region of the laser driver and the second projection region of the limiting amplifier on the circuit board.

21. The method according to claim 13, wherein:
an arrangement density of the plurality of via holes gradually decreases outward from centers of in the first projection region of the laser driver and the second projection region of the limiting amplifier on the circuit board.

22. The method according to claim 13, wherein:
diameters of the plurality of via holes gradually decrease outward from centers of in the first projection region of the laser driver and the second projection region of the limiting amplifier on the circuit board.

* * * * *